US012624138B2

(12) United States Patent
Lin et al.

(10) Patent No.: US 12,624,138 B2
(45) Date of Patent: May 12, 2026

(54) BRUSH FOR CLEANING WAFERS AFTER CHEMICAL MECHANICAL POLISHING (CMP) PROCESS

(71) Applicant: Taiwan Semiconductor Manufacturing Company, Ltd., Hsinchu (TW)

(72) Inventors: Jhih-Fong Lin, Hsinchu (TW); Liqing Wen, Hsinchu (TW); Le Lu, Taipei (TW); Deng-Gao Chen, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 458 days.

(21) Appl. No.: 18/168,380

(22) Filed: Feb. 13, 2023

(65) Prior Publication Data

US 2024/0180324 A1    Jun. 6, 2024

Related U.S. Application Data

(60) Provisional application No. 63/386,034, filed on Dec. 5, 2022.

(51) Int. Cl.
| | |
|---|---|
| *C08F 216/06* | (2006.01) |
| *A46B 13/00* | (2006.01) |
| *A46D 3/00* | (2006.01) |
| *C08J 9/06* | (2006.01) |
| *C08J 9/32* | (2006.01) |
| *A46B 1/00* | (2006.01) |

(Continued)

(52) U.S. Cl.
CPC .......... *C08F 216/06* (2013.01); *A46B 13/001* (2013.01); *A46D 3/00* (2013.01); *C08J 9/06* (2013.01); *C08J 9/32* (2013.01); *A46B 1/00*

(2013.01); *A46B 2200/3086* (2013.01); *B08B 1/12* (2024.01); *C08F 2400/02* (2013.01); *H10P 72/0412* (2026.01)

(58) Field of Classification Search
CPC ....... C08F 216/06; C08F 2400/02; C08J 9/06; C08J 9/32; H01L 21/67046; A46B 2200/3086; A46B 13/001; A46B 1/00; A46D 3/00; B08B 1/12; H10P 72/0412; C08L 53/00
See application file for complete search history.

(56) References Cited

U.S. PATENT DOCUMENTS

| | | | | |
|---|---|---|---|---|
| 2005/0092350 A1* | 5/2005 | Buehler | .................... | B08B 1/40 15/244.4 |
| 2006/0151003 A1* | 7/2006 | Liou | ......................... | B08B 1/34 134/2 |

(Continued)

OTHER PUBLICATIONS

Machine translation of CN 110335837 by Zou et al (Year: 2019).*

*Primary Examiner* — Christina H.W. Rosebach
(74) *Attorney, Agent, or Firm* — Ingrassia Fisher & Lorenz, LLP

(57) ABSTRACT

Brushes for cleaning wafers after a Chemical Mechanical Polishing (CMP) process and methods for fabricating such brushes are provided. An exemplary method for fabricating a brush for cleaning wafers after a Chemical Mechanical Polishing (CMP) process includes forming a brush configured for contacting the wafers; and, while forming the brush, controlling formation of pores within the brush to a maximum pore dimension, wherein the maximum pore dimension is 1000 nanometers (nm).

20 Claims, 12 Drawing Sheets

160

105

100

(51) Int. Cl.
    *B08B 1/12*         (2024.01)
    *H10P 72/00*      (2026.01)

(56)           References Cited

U.S. PATENT DOCUMENTS

2022/0125193 A1*   4/2022   Hsu ........................ B29C 39/02
2024/0082881 A1*   3/2024   Kwon .............. H01L 21/02074

* cited by examiner

BRUSH FOR CLEANING WAFERS AFTER CHEMICAL MECHANICAL POLISHING (CMP) PROCESS

CROSS-REFERENCE TO RELATED APPLICATIONS

This application claims the benefit of U.S. Provisional Application No. 63/386,034, filed Dec. 5, 2022, which is incorporated herein by reference in its entirety.

BACKGROUND

Chemical Mechanical Polishing (CMP) processes are widely used in the fabrication of integrated circuits. When an integrated circuit is built up layer by layer on the surface of a semiconductor wafer, CMP processes are used to planarize the topmost layer to provide a planar surface for subsequent steps in the fabrication process. CMP processes are carried out by polishing the wafer surface against a polishing pad. A slurry containing both abrasive particles and reactive chemicals is applied to the polishing pad. The relative movement of the polishing pad and the wafer surface coupled with the reactive chemicals in the slurry allows the CMP process to planarize or polish the wafer surface by means of both physical and chemical forces.

After a CMP process, the polished wafer surface is cleaned to remove CMP residue, such as organic matter and abrasive slurry particles, in order to ready the surface for subsequent photolithography processes and other steps in the fabrication process. In conventional post-CMP cleaning processes, brushes are used to remove the residue on the polished wafers. The brushes are typically formed of sponges.

Although existing apparatuses and methods for a post-CMP cleaning process have been generally adequate for their intended purposes, as features sizes have reduced, conventional post-CMP cleaning processes have led to particle defect issues, such as from slurry abrasives, polish wastes, and byproducts.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

FIGS. 5-15 are structural formulas of exemplary compounds used in forming an exemplary brush of FIG. 4 in accordance with some embodiments.

DETAILED DESCRIPTION

Figure 1:
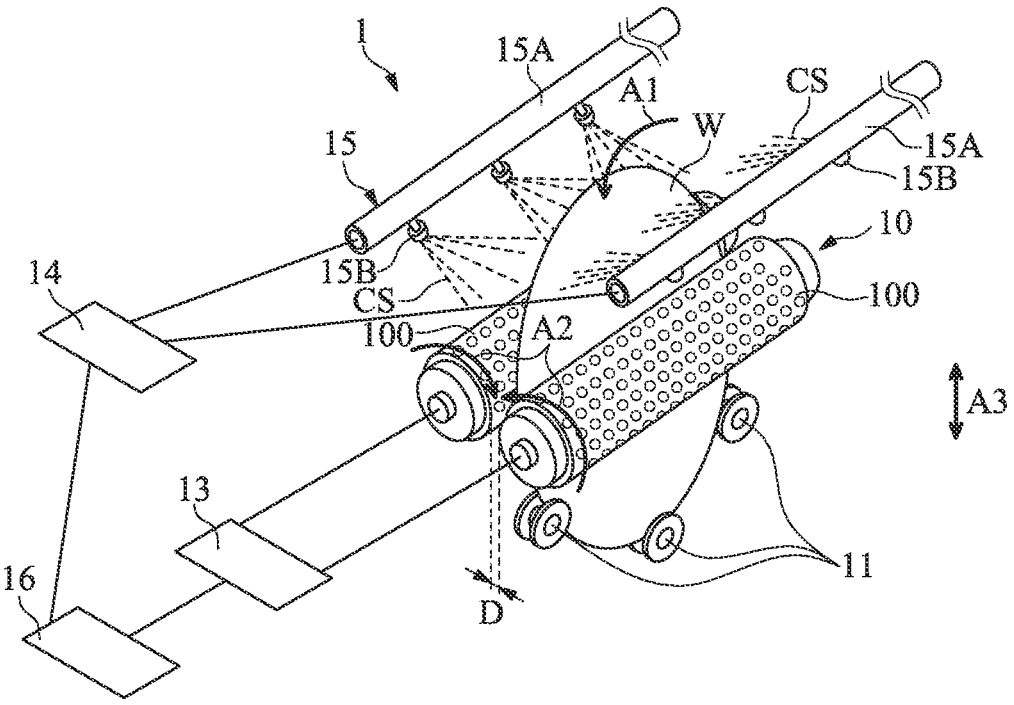
FIG. 1 is a schematic perspective view of partial elements of a post-CMP cleaning apparatus in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

As used herein, a "material layer" or a layer that is a "material" includes at least 50 wt. % of the identified material, for example at least 60 wt. % of the identified material, such at least 75 wt. % of the identified material or at least 90 wt. % of the identified material. In certain embodiments, a "material layer" or a layer that is a "material" includes at least 95 wt. % of the identified material, for example at least 99 wt. % of the identified material, such at least 99.9 wt. % of the identified material.

In addition, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices and methods of forming the same. Various embodiments are discussed herein in a particular context, namely, in the context of post-CMP cleaning processes. However, it is noted that the present disclosure is not limited to use after CMP processing.

In conventional processing, brushes are used in to remove contaminants from wafers by mechanical force. However, it has been found herein that CMP processing may suffer particle defect issues from slurry abrasives, polish wastes, and byproducts having a maximum dimension of from 10 to 100 nm, particularly in view of technology scaling and different types of materials in advanced technology nodes.

Thus, embodiments herein provide for surface engineering brushes to improve the ability to remove particles having a maximum dimension of from 10 to 100 nm, and to avoid surface reactions on the brush. For example, embodiments herein provide for fabricating post-CMP brushes from PVA-copolymer or other polymers with different functional groups, and which include a cellulose, lignin, nylon, or polytetrafluoroethylene (PTFE) backbone, to increase brush-particle affinity. Further, embodiments herein provide for brushes with nanometer (nm) scaled pores and with designed porosity.

The use of improved materials and smaller pore size may provide better post-CMP cleaning performance. Further, yield and productivity may be improved after post-CMP cleaning by a reduction in the amount of tiny particles remaining on wafers.

Figure 18:
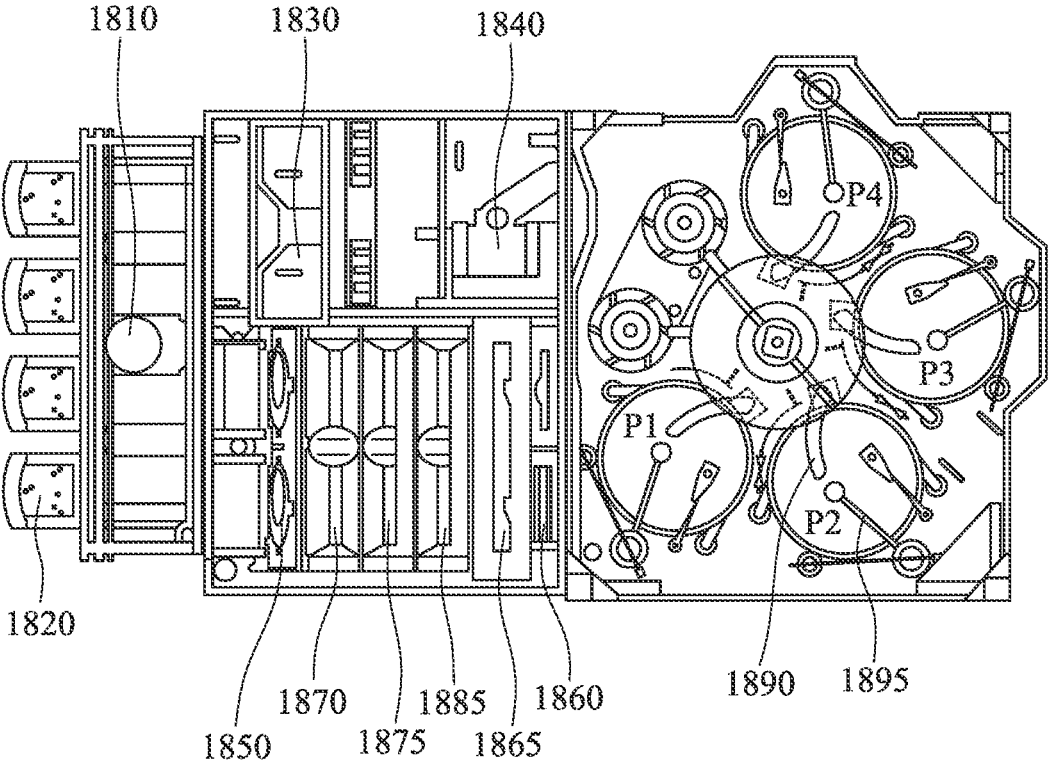
FIG. 18 is a schematic perspective view of a CMP tool in accordance with some embodiments.

FIG. 18 schematically illustrates a CMP tool in accordance with some embodiments. As shown, CMP tool 1800 includes a dry metrology device 1820, a FI robot 1810, an IPA dryer 1850, a pass through 1830, a second brush box 1875, a first brush box 1870, a pre-clean 1885, a wet robot 1840, a mega 1865, an input shuttle 1860, a slurry arm 1890, and a PC arm 1895.

FIG. 1 schematically illustrates a perspective view of a part of a post-CMP cleaning apparatus 1 in accordance with some embodiments of the present disclosure. The post-CMP cleaning apparatus 1 may be used to clean a wafer W after a CMP process, such as performed with CMP tool 1800. More specifically, the post-CMP cleaning apparatus 1 may be used to perform a post-CMP cleaning to remove CMP residue, such as organic matter and abrasive slurry particles, from both surfaces (including the polished wafer surface and backside surface) of the wafer W, in order that the surfaces be made ready for subsequent steps in the fabrication process. The wafer W may be a production wafer or a test wafer made of silicon or other semiconductor materials.

Figure 2:
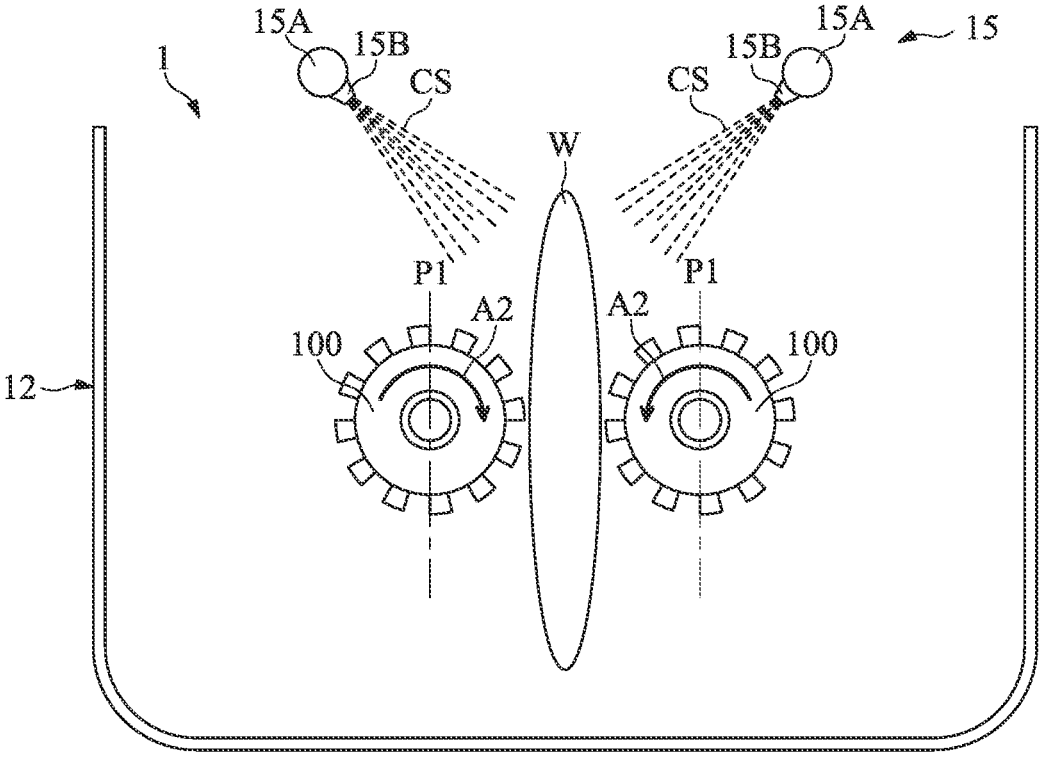
FIG. 2 is a schematic side view of the post-CMP cleaning apparatus of FIG. 1 in accordance with some embodiments.

As shown in FIG. 1, the post-CMP cleaning apparatus 1 includes a brush cleaner 10 including a pair of brushes 100 for performing a scrubbing process onto both surfaces of the polished wafer W. During the scrubbing process, the wafer W is supported by several rollers 11 (support mechanism) in a vertical orientation in a cleaning chamber 12 (as shown in FIG. 2) which encloses the brush cleaner 10, and is rotatable by the rollers 11 such as the direction indicated by arrow A1 in FIG. 1.

The brushes 100 may, for example, be porous, and/or may be made of a resilient material as described below in conjunction with FIGS. 4-15. During the scrubbing process, each brush 100 is mounted on and rotatable, such as in the direction indicated by arrow A2 in FIG. 1, about a respective spindle (not shown). Each brush 100 may be driven by a drive mechanism 13 (for example a motor) or mechanisms to move vertically, such as in the direction indicated by double-headed arrow A3 in FIG. 1) along the diameter direction of the wafer W and rotate/scrub over both surfaces of the wafer W. Also, the horizontal space D between the two brushes 100, related to the scrubbing force applied to the wafer W, is adjustable by moving the brushes 100 via the drive mechanism 13.

The post-CMP cleaning apparatus 1 also includes a fluid delivery unit 14 for delivering a cleaning solution CS to the wafer W via a spray unit 15. The cleaning solution CS may aid the scrubbing process performed by the brush cleaner 10 by washing the CMP residue from the brushes 100 and/or the surfaces of the wafer W.

The cleaning solution CS may include various types, wherein different types of the cleaning solution CS may be used to clean different CMP residue on the wafer W. In accordance with some embodiments, the cleaning solution CS includes water with no chemicals intentionally added. The cleaning solution CS may also be deionized water. In certain embodiments, the cleaning solution CS includes an acid aqueous solution, which may include an organic acid such as citric acid, an inorganic acid such as $HNO_3$, or the like. In certain embodiments, the cleaning solution CS includes an alkaline aqueous solution, which may include an organic base such as $NR_3$ (with R being alkyl), an inorganic base such as $NH_4OH$, or the like. Surfactants such as sodium dodecyl sulfate may also be added into the cleaning solution CS to reduce the surface tension thereof. The cleaning solution CS may include water as a solvent. Alternatively, the cleaning solution CS may use organic solvents such as methanol. The cleaning solution CS may also be an aqueous solution including peroxide. For example, the cleaning solution CS may include $H_2O_2$ in water. In some embodiments, an acid such as dicarboxylic acid, hydrofluoric acid (HF) or phosphoric acid ($H_3PO_4$) is used as the cleaning solution. In some embodiments, a base solution such an ammonium hydroxide (NH4OH) is used as the cleaning solution. In some embodiments, a mixed solution is used as the cleaning solution. Examples of the mixed solutions include, but are not limited to, a mixture of an ammonium hydroxide (NH4OH), hydrogen peroxide (H2O2), and DI water, or a mixture of ammonium hydrogen fluoride (NH4F), HF, and DI water. In some embodiments, a solvent such as, for example, chloroform (CHCl3), dichloromethane (CH2Cl2), or benzene (C6H6), acetone ((CH3)2CO), or a mixture thereof is used as the cleaning solution.

To increase the cleaning efficiency, depending on types of contaminants remaining on the substrate and the cleaning solution used, the cleaning solution is either heated to a temperature above an ambient temperature or cooled to a temperature below an ambient temperature. In some embodiments, the cleaning solution is heated to a temperature of from 30° C. to 100° C. In some embodiments, the cleaning solution is cooled to a temperature of from −10° ° C. to 10° C. The heated or cooled cleaning solution helps to remove more contaminants from surfaces of the substrate compared to the cleaning solution at the ambient temperature. As a result, the overall device yield and device reliability are improved.

As shown in FIG. 1, the spray unit 15 includes a pair of spray bars 15A fluidly connected to the fluid delivery unit 14. The two spray bars 15A are respectively adjacent to both sides of the wafer W. Several nozzles 15B are mounted on each spray bar 15A for spraying the cleaning solution CS onto the wafer W. Although not shown, during the scrubbing process, the two spray bars 15A may be driven by a drive mechanism (for example a motor) or mechanisms to rotate (to predetermined orientations) so that the cleaning solution CS is accurately directed to both surfaces of the wafer W via the nozzles 15B. The spray bars 15A may comprise a metal material (such as stainless steel). The nozzles 15B may comprise ceramics, quartz, or any other anti-corrosive materials (such as plastic).

The exemplary post-CMP cleaning apparatus 1 also includes a controller 16 coupled to the fluid delivery unit 14 and the drive mechanism 13 and configured to control their operation. For example, the controller 16 may comprise a microprocessor, and the microprocessor may be programmed to active and/or control the fluid delivery unit 14 so as to deliver the cleaning solution CS to the spray unit 15 at predetermined times and/or rates, and/or for a predetermined length of time. Similarly, the microprocessor of the controller 16 may be programmed to active and/or control the drive mechanism 13 so as to move and/or rotate the brushes 100 of the brush cleaner 10 at predetermined times and/or rates, and/or for a predetermined length of time. Although not shown, the controller 16 may also be coupled to the rollers 11 and exert similar control over the rotation of the wafer W.

FIG. 2 provides a schematic cross-sectional view of a post-CMP cleaning apparatus (for example the post-CMP cleaning apparatus 1 described above) in accordance with some embodiments. The brushes 100 in the post-CMP cleaning apparatus 1 are configured to be moved to and from a first position P1 shown in FIG. 2.

At the first position P1, the brushes 100 may perform a scrubbing process upon the polished wafer W after a CMP process. More specifically, after the wafer W is vertically loaded into the chamber 12, the brushes 100 may move vertically, along the diameter direction of the wafer W to rotate/scrub, such as in the direction of arrows A2 in FIG. 2, over both surfaces of the wafer W while wafer W is rotated by several rollers (not shown). At the same time, a cleaning solution CS may be sprayed onto both surfaces of the wafer W via the spray unit 15 described above. Through cooperation of the scrubbing force from the brushes 100 and the washing force of the cleaning solution CS, the CMP residue on the surfaces of the wafer W is removed.

With the above configuration, the CMP residue on both surfaces of the wafer W can be removed by the scrubbing force from the brush cleaner 10 in cooperation with the washing force of the cleaning solution CS. Although the post-CMP cleaning apparatuses 1 of embodiments described above are used to clean both surfaces of the polished wafer W, the subject matter is not limited thereto. That is to say, an apparatus 1 may be provided for cleaning only the polished wafer surface of the wafer W. It should be understood that the above post-CMP cleaning apparatus is merely exemplary.

Figure 3:
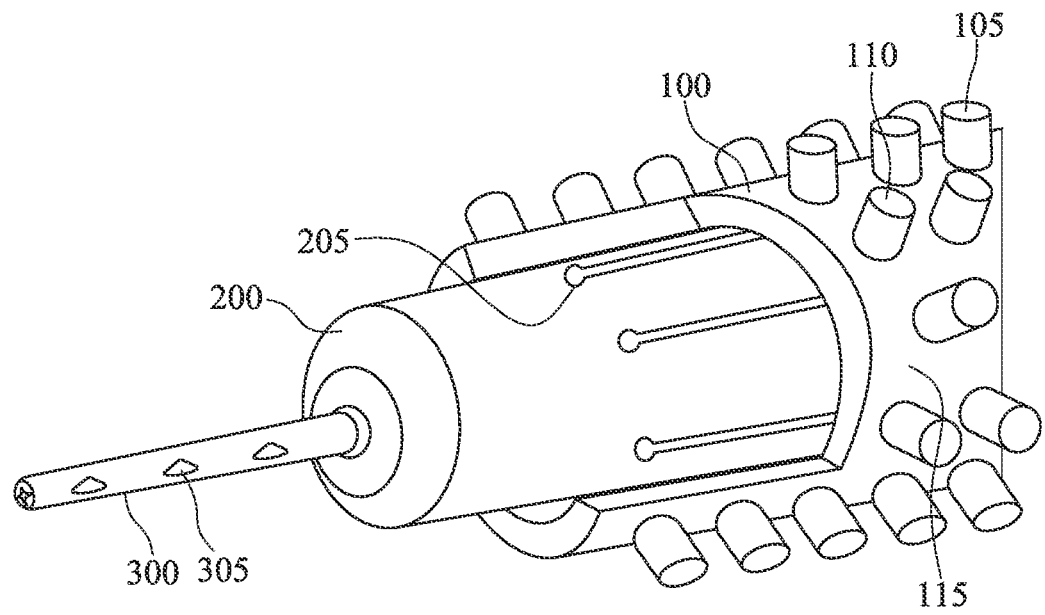
FIG. 3 is a schematic perspective cutaway diagram of an exemplary brush for use in the apparatus of FIGS. 1 and 2 in accordance with some embodiments.

Referring now to FIG. 3, the structure of an exemplary brush cleaner 10 is illustrated. As shown, the brush cleaner 10 includes a brush 100 that forms the outer surface 105 of the brush cleaner. An exemplary brush 100 is porous. In an exemplary brush cleaner 10, the brush 100 is formed as a cylindrical sleeve that fits around a core 200. In exemplary embodiments, the brush cleaner 10 further includes a tubing 300 that is received within the core 200. As shown, the tubing 300 is formed with apertures 305 and the core 200 is formed with channels 205 through which the cleaning solution may flow to the brush 100 and into contact with the wafer.

The outer surface 105 of the brush 100 may be formed with a plurality of spaced-apart projections 110 or nodules disposed to protrude away from the sleeve member 115. In the illustrated embodiment, the projections 110 may have a tubular configuration, such as with a circular cross-section. However, the projections 110 may have any suitable shape and cross-section, for example, the projections may be circular, ellipsoidal, rectangular, diamond, hexagonal, etc. The projections 110 may be uniformly distributed over the sleeve member 115.

Figure 4:
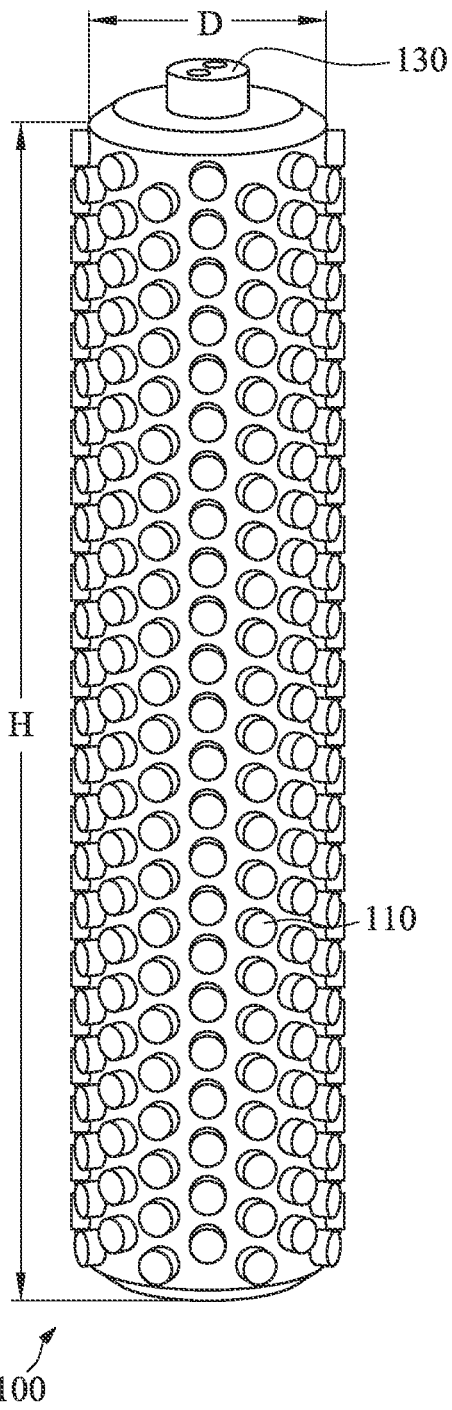
FIG. 4 is a schematic perspective view of an exemplary brush for use in the apparatus of FIGS. 1 and 2 in accordance with some embodiments.

FIG. 4 is a perspective view of an exemplary brush 100. As shown, the projections 110 are arranged in a geometric pattern of alternating columns. The distal end 130 of the brush 100 may be substantially closed and the proximal end open (not shown) to receive and sit on a core or shaft for rotating the brush 100 during a wafer cleaning process.

As shown, an exemplary brush 100 has a cylindrical shape with a diameter D of from 3 to 15 centimeters (cm) and a length or height H of from 25 to 50 cm. While these dimensions are provided, any size suitable for cleaning a selected wafer may be used.

According with embodiments herein, the brush 100 is formed from a porous material. In exemplary embodiments, the pores have a pore size characterized by SEM cross-section of from 50 to 1000 nanometers (nm).

In exemplary embodiments, the porous material of the brush 100 has an apparent density of from 0.02 to 2.5 g/cm$^3$.

In exemplary embodiments, the outer surface 105 of the brush 100 has a surface mean roughness suitable to increase physical contact with particles to remove the particles from a wafer.

In certain embodiments, the brush 100, or at least the outer surface 105 of brush 100 is formed with functional groups to adjust brush-particle affinity. In certain embodiments, the brush 100, or at least the outer surface 105 of brush 100 is a polyvinyl alcohol (PVA)-copolymer or functionalized PVA with carboxylic, sulfonic, amino or amide groups, and includes a backbone material such as cellulose, lignin, nylon, or polytetrafluoroethylene (PTFE). Such materials, or combinations of materials may adjust particle-brush affinity to more efficiently remove particles from wafers.

Figures 5, 6:
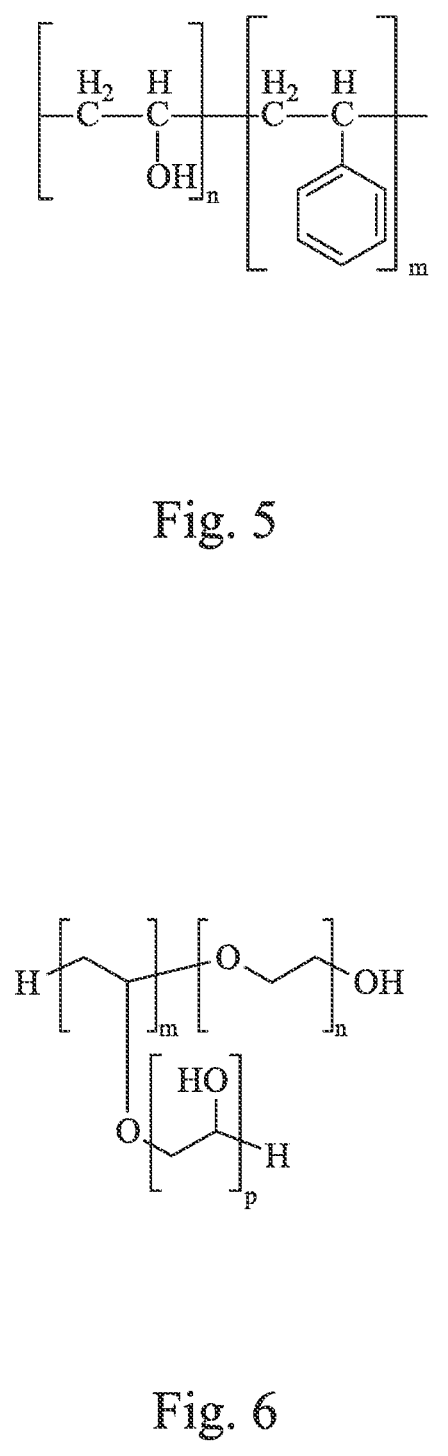

In certain embodiments, the brush 100, or at least the outer surface 105 of brush 100 is a polyvinyl alcohol (PVA)-copolymer. For example, in certain embodiments, the brush 100, or at least the outer surface 105 of brush 100 is a copolymer of polyvinyl alcohol-b-polystyrene (PVA-b-PS). The chemical structure of PVA-b-PS is illustrated in FIG. 5. In exemplary embodiments, PVA-b-PS may be obtained by radical polymerization from polyvinyl acetate and styrene, followed by hydrolysis in basic condition.

In certain embodiments, the brush 100, or at least the outer surface 105 of brush 100 is a copolymer of polyvinyl alcohol-b-polyethylene glycol (PVA-b-PEG). The chemical structure of PVA-b-PEG is illustrated in FIG. 6. In exemplary embodiments, PVA-b-PEG may be synthesized by condensation polymerization from PVA and PEG.

Figures 7, 8:
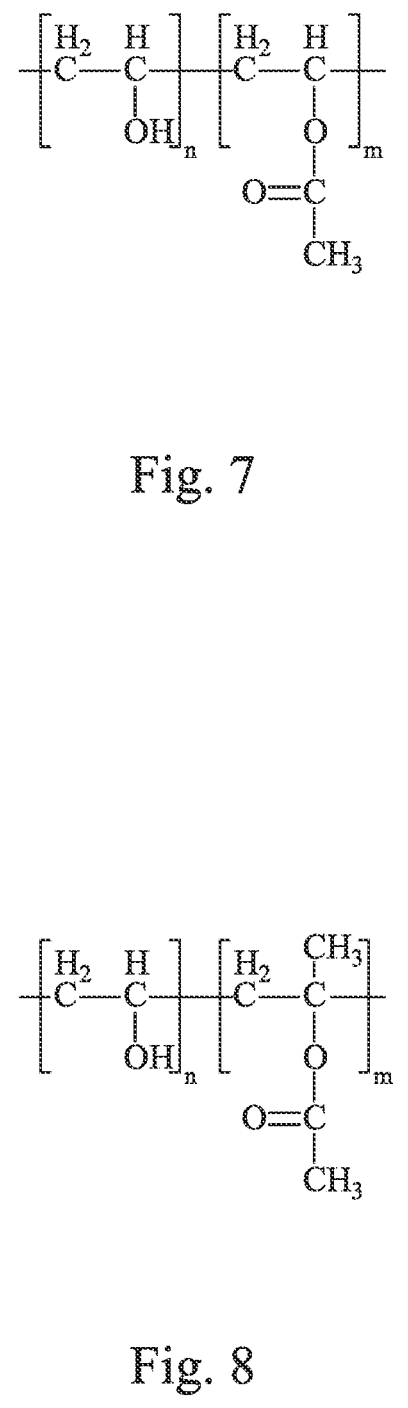

In certain embodiments, the brush 100, or at least the outer surface 105 of brush 100 is a copolymer of polyvinyl alcohol-b-polymethyl acrylate (PVA-b-PMA). The chemical structure of PVA-b-PMA is illustrated in FIG. 7.

In certain embodiments, the brush 100, or at least the outer surface 105 of brush 100 is a copolymer of polyvinyl alcohol-b-polymethyl methacrylate (PVA-b-PMMA). The chemical structure of PVA-b-PMMA is illustrated in FIG. 8.

In certain embodiments, the brush 100, or at least the outer surface 105 of brush 100 is a functionalized polyvinyl alcohol (PVA) polymer.

Figures 9, 10, 11:
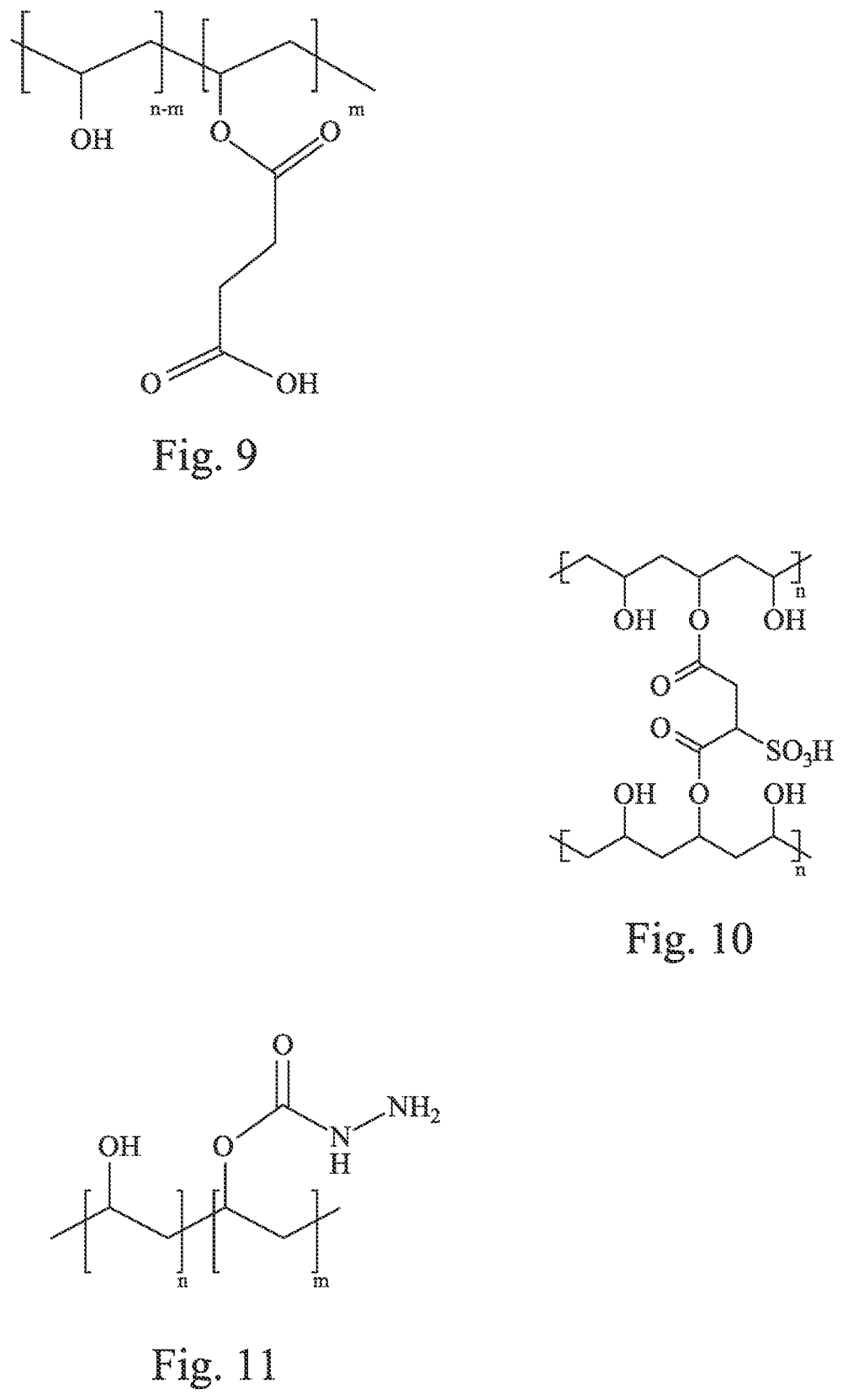

For example, in certain embodiments, the brush 100, or at least the outer surface 105 of brush 100 is a carboxylic-functionalized PVA: PVA-COOH polymer, as shown in FIG. 9.

In certain embodiments, the brush 100, or at least the outer surface 105 of brush 100 is a sulfonic-functionalized PVA: PVA-SO$_3$H polymer, as shown in FIG. 10.

In certain embodiments, the brush 100, or at least the outer surface 105 of brush 100 is an amino or amide-functionalized PVA: PVA-NH$_2$ polymer, as shown in FIG. 11.

Each functionalized PVA polymer can be obtained by condensation reactions. For example, a condensation reaction with cross-linked poly(vinyl alcohol)-sulfosuccinic acid may be used to form sulfonic-functionalized PVA. Further, a condensation reaction with copoly(vinyl alcohol/4-(but-2-en-2-yloxy)-4-oxobutanoic acid) may be used to form a carboxylic-functionalized PVA.

In certain embodiments, the brush 100, or at least the outer surface 105 of brush 100 is formed with a selected polymer backbone.

Figures 12, 13:
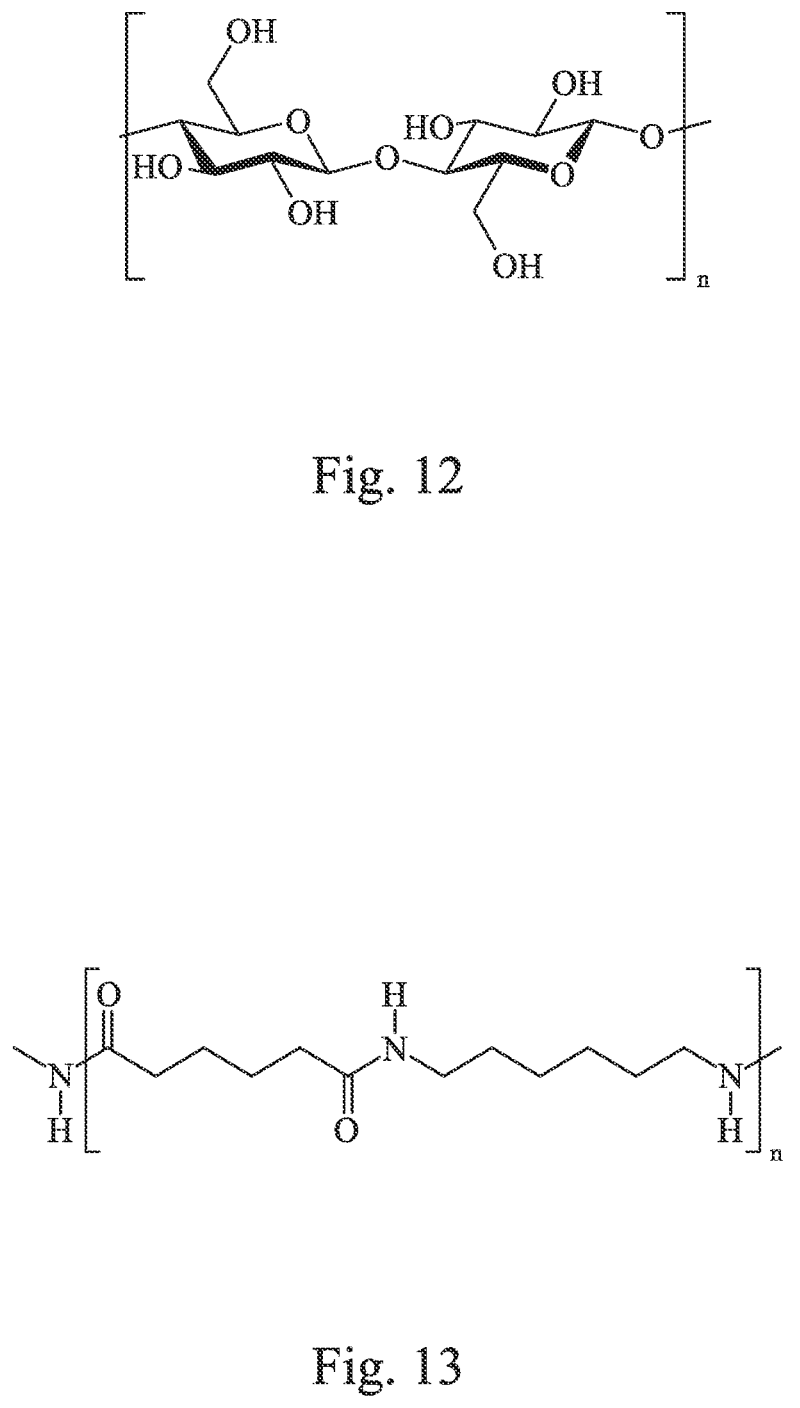

For example, in certain embodiments, the brush 100, or at least the outer surface 105 of brush 100 is a material with a cellulose polymer backbone, such as shown in FIG. 12.

In certain embodiments, the brush 100, or at least the outer surface 105 of brush 100 is a material with a nylon polymer backbone, such as shown in FIG. 13.

Figures 14, 15:
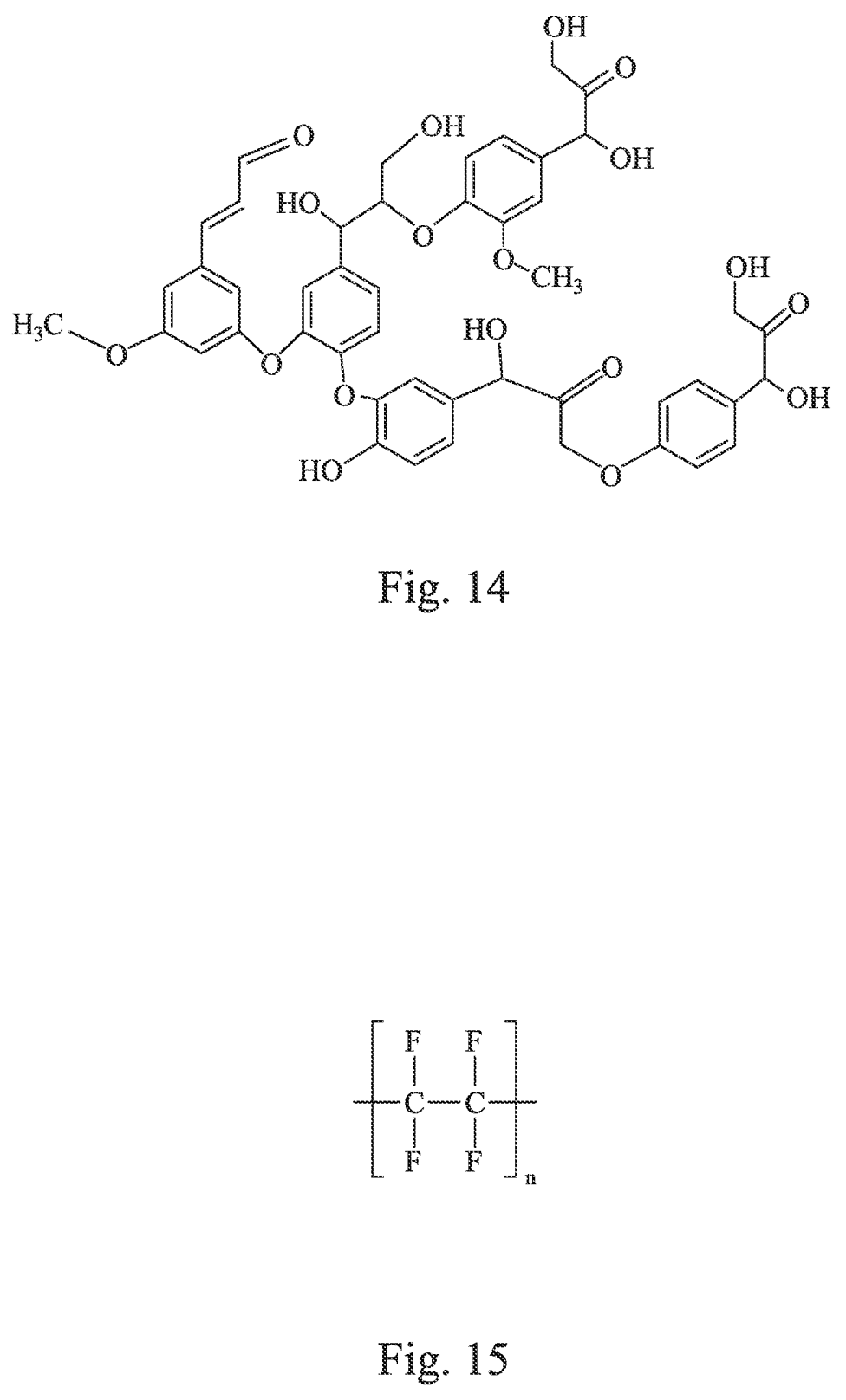

In certain embodiments, the brush 100, or at least the outer surface 105 of brush 100 is a material with a lignin polymer backbone, such as shown in FIG. 14.

For example, in certain embodiments, the brush 100, or at least the outer surface 105 of brush 100 is a material with a polytetrafluoroethylene (PTFE) polymer backbone, such as shown in FIG. 15.

Infrared spectroscopy may be used to characterize functional groups of —COOH (from 1685 to about 1780 cm$^{-1}$), —SO$_3$ (from 1320 to 1380 cm$^{-1}$), —OH (from 3200 to 3550 cm$^{-1}$) and —NH$_2$ (about 3500 cm$^{-1}$) for PVA co-polymers, functionalized PVA, and backbone materials including cellulose, lignin, nylon and PTFE.

An exemplary brush formed from a polyvinyl alcohol (PVA)-copolymer and/or from a functionalized polyvinyl alcohol (PVA) polymer, and with a polymer backbone, such as described above, provides for increased affinity between the brush and particles to be removed from the wafer during a cleaning process. As a result, such particles may be efficiently removed from the wafer surface.

Without being bound by the theory, it is believed that the brush-particle affinity is increased due to functional groups on the brush surface with Van Der Waals forces, static charges, hydrogen bonding, ionic attraction, and/or chemical bonding over particle bodies.

Also, by using a selected polymer backbone, more chemically inert properties provided by the polymer backbone, as compared with the properties of PVA, can prevent particles attachment to the brush outer surface through chemical reactions on the brushes. Thereby, an incoming wafer will not be polluted by brushes used to clean a previous wafer, overall process yields are maintained. Further, preventing particles from attaching to brush surface, may reduce need for a particle removal process for cleaning the brush itself.

As noted above, an exemplary brush 100 is formed from a porous material. In exemplary embodiments, the pores have a pore size measured by Scanning Electron Microscopy (SEM) to be from 50 to 1000 nanometers (nm). Specifically, a maximum cross-sectional pore size is 1000 nm and a minimum cross-sectional pore size is 50 nm.

Figure 16:
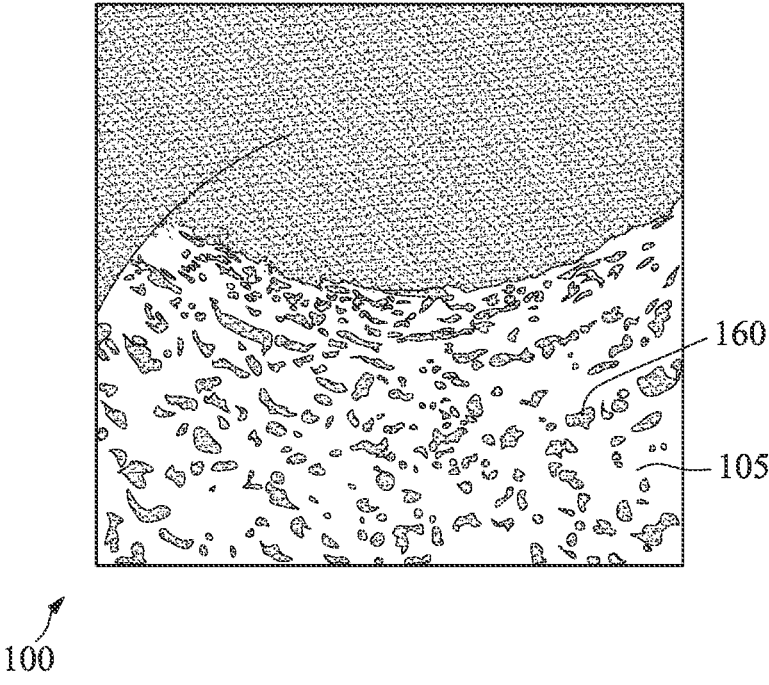
FIG. 16 is a scanning electron micrograph (SEM) of a porous material forming a brush in accordance with some embodiments.

FIG. 16 is a scanning electron microscope (SEM) plane view of the outer surface 105 of brush 100 in accordance with some embodiments. As shown, the material forming the brush 100 is porous, and is formed with irregular pores 160.

As explained above, each pore 160 has a pore dimension. An exemplary porous material is characterized by pores having a minimum pore dimension of at least 50, at least 100, at least 150, at least 200, at least 250, at least 300, at least 350, at least 400, at least 450, at least 500, at least 550, at least 600, at least 650, at least 700, at least 750, at least 800, at least 850, at least 900, or at least 950 nm. Further, an exemplary porous material is characterized by a maximum pore dimension of no more than 1000, no more than 950, no more than 900, no more than 850, no more than 800, no more than 750, no more than 700, no more than 650, no more than 600, no more than 550, no more than 500, no more than 450, no more than 400, no more than 350, no more than 300, no more than 250, no more than 200, no more than 150, or no more than 100 nm.

Without being bound by the theory, it is believed that the pore size of the porous material increases physical contact between the brush outer surface and the particles being removed, with pore sizes matching dimensions of the particles to be removed, i.e., pores fit inline particle sizes.

In exemplary embodiments, the pore size of the material forming the brush 100 is controlled during formation of the brush.

For example, pore sizes may be controlled by changing the degrees of polymerization of the material. In certain embodiments, the degree of polymerization (DP) is from 500 to 20000. In certain embodiments, a foamed co-polymer or functionalized polymer is synthesized from PVA with a degree of polymerization (DP) of from 500 to 20000 to control pore size and hardness. In such embodiments, the material takes shape in a designed mold.

In other embodiments, pore sizes may be controlled by using nanobubbles, such as having diameters of less than 1000 nm, as filler when the polymer is taking shape in the mold to form pores. For example, nanobubble generators may use pressurized dissolution, electrolysis, or may swirl fluids in a mixing chamber, and then purge the fluids through a shear point, injector, or venturi to produce nanobubbles that are added to the polymer material before the polymer is molded.

In exemplary embodiments, the nanobubbles have diameters of less than 950 nm, less than 900 nm, less than 850 nm, less than 800 nm, less than 750 nm, less than 700 nm, less than 650 nm, less than 600 nm, less than 550 nm, less than 500 nm, less than 450 nm, less than 400 nm, less than 350 nm, less than 300 nm, less than 250 nm, less than 200 nm, less than 150 nm, or less than 100 nm. In exemplary embodiments, the nanobubbles have diameters of greater than 50 nm, greater than 100 nm, greater than 150 nm, greater than 200 nm, greater than 250 nm, greater than 300 nm, greater than 350 nm, greater than 400 nm, greater than 450 nm, greater than 500 nm, greater than 550 nm, greater than 600 nm, greater than 650 nm, greater than 700 nm, greater than 750 nm, greater than 800 nm, greater than 850 nm, greater than 900 nm, or greater than 950 nm.

In other embodiments, pore sizes may be controlled by adding pore foaming forming chemicals to the polymer material. For example, pore forming chemicals such as starch sulfate additives may be added as filler during foaming.

Figure 17:
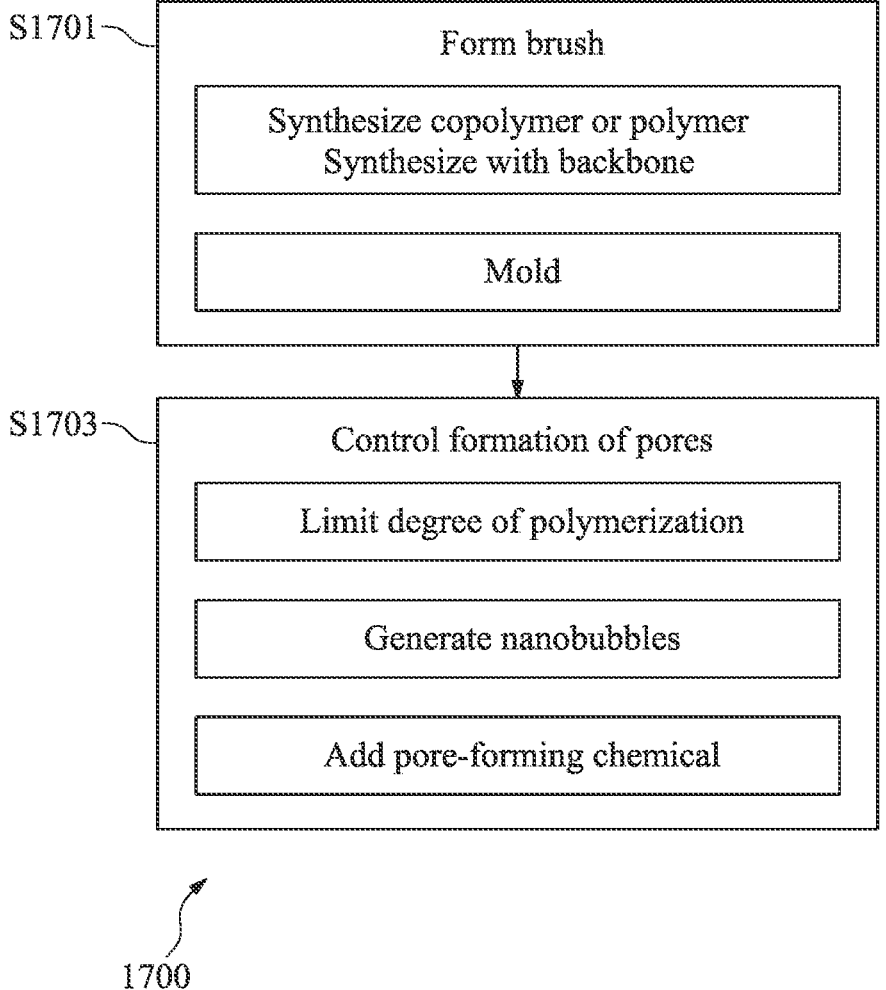
FIG. 17 is a flow chart illustrating a method for fabricating a brush in accordance with some embodiments.

Referring now to FIG. 17, a method 1700 for fabricating a brush for cleaning wafers after a Chemical Mechanical Polishing (CMP) process is illustrated.

As shown, method 1700 includes forming the brush configured for contacting the wafers at action 1701. Action 1701 may include synthesizing a desired PVA-copolymer or desired functionalized PVA polymer. In exemplary embodiments, action 1701 includes synthesizing a PVA-copolymer material selected from PVA-b-PS, PVA-b-PMMA, PVA-b-PEG, and PVA-b-PMA. In exemplary embodiments, action 1701 includes synthesizing a functionalized PVA polymer selected from PVA-COOH, PVA-SO$_3$H, and PVA-NH$_2$.

Action 1701 may further include synthesizing the desired copolymer or polymer with a selected polymer backbone. For example, the polymer backbone may be selected from cellulose, lignin, nylon, and polytetrafluoroethylene (PTFE).

Action 1701 may further include injecting or otherwise locating the synthesized copolymer or polymer in mold for forming the shape of the brush. The synthesized copolymer or polymer may cure in the mold for a selected duration of time.

Further, method 1700 may include, which synthesizing the desired polymer or copolymer at action 1701, controlling the formation of pores within the polymer or copolymer at action 1703. Each pore is defined with a pore dimension. For example, the diameter of a spherical pore is the spherical pore's pore dimension. More generally, the pore dimension of a pore is the longest line from the pore surface across the pore to an opposite pore surface. As described herein, formation of pores may be controlled to a maximum pore dimension. An exemplary maximum pore dimension may be 1000 nanometers (nm), or smaller as described above. Further, formation of pores may be controlled to a minimum pore dimension. An exemplary minimum pore dimension may be 50 nanometers (nm), or larger as described above.

In certain embodiments, controlling the formation of pores within the polymer or copolymer at action 1703 may include limiting a degree of polymerization within the copolymer or polymer to from 500 to 20,000 degrees of polymerization.

In certain embodiments, controlling the formation of pores within the polymer or copolymer at action 1703 may include generating nanobubbles having a maximum diameter of 1000 nanometers (nm) in the copolymer or polymer.

In certain embodiments, controlling the formation of pores within the polymer or copolymer at action 1703 may include adding a pore-forming chemical as filler to the copolymer or polymer.

In an exemplary embodiment, a method for fabricating a brush for cleaning wafers after a Chemical Mechanical Polishing (CMP) process is provided. The method includes forming the brush configured for contacting the wafers; and, while forming the brush, controlling formation of pores within the brush to a maximum pore dimension, wherein the maximum pore dimension is 1000 nanometers (nm).

In certain embodiments, the method further includes controlling formation of the pores within the brush to a minimum pore dimension of 50 nanometers (nm).

In certain embodiments of the method, the brush is formed from a material, and controlling formation of pores within the brush to the maximum pore dimension comprises limiting a degree of polymerization within the material to from 500 to 20,000 degrees of polymerization.

In certain embodiments of the method, the brush is formed from a material, and controlling formation of pores within the brush to the maximum pore dimension comprises generating nanobubbles having a maximum diameter of 1000 nanometers (nm) in the material.

In certain embodiments of the method, the brush is formed from a material, and controlling formation of pores within the brush to the maximum pore dimension comprises adding a pore-forming chemical as filler to the material.

In certain embodiments of the method, forming the brush comprises synthesizing a PVA-copolymer material.

In certain embodiments of the method, forming the brush comprises synthesizing a PVA-copolymer material with a polymer backbone selected from cellulose, lignin, nylon, and polytetrafluoroethylene (PTFE).

In certain embodiments of the method, forming the brush comprises synthesizing a functionalized PVA polymer.

In certain embodiments of the method, forming the brush comprises synthesizing a functionalized PVA polymer with a polymer backbone selected from cellulose, lignin, nylon, and polytetrafluoroethylene (PTFE).

In an exemplary embodiment, a method for fabricating a brush for cleaning wafers after a Chemical Mechanical Polishing (CMP) process is provided. The method includes forming the brush with an outer surface configured for contacting the wafers, wherein the outer surface is formed from a material selected from a PVA-copolymer and a functionalized PVA polymer, and having a polymer backbone.

In certain embodiments of the method, forming the brush comprises synthesizing a PVA-copolymer material.

In certain embodiments of the method, forming the brush comprises synthesizing a functionalized PVA polymer.

In certain embodiments of the method, forming the brush comprises synthesizing a material with a polymer backbone.

In certain embodiments, the method further includes, while forming the brush, controlling formation of pores within the brush to a maximum pore dimension.

In an exemplary embodiment, a brush for cleaning wafers after a Chemical Mechanical Polishing (CMP) process is provided. The brush includes a sleeve member and a plurality of spaced-apart nodules disposed to protrude from the sleeve member, wherein an outer surface of the nodules is formed by a porous polymeric material having pores, and wherein the pores have a maximum pore dimension of 1000 nanometers (nm).

In an exemplary embodiment, the pores have a minimum pore dimension of 50 nm.

In an exemplary embodiment, the material is a PVA-copolymer or a functionalized PVA polymer, and has a polymer backbone.

In an exemplary embodiment, the material is a PVA-copolymer selected from PVA-b-PS, PVA-b-PMMA, PVA-b-PEG, and PVA-b-PMA.

In an exemplary embodiment, the material is a functionalized PVA polymer selected from PVA-COOH, PVA-SO$_3$H, and PVA-NH$_2$.

In an exemplary embodiment, the material has a polymer backbone selected from cellulose, lignin, nylon, and polytetrafluoroethylene (PTFE).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a brush, the method comprising:

forming the brush; and while forming the brush, controlling formation of pores within the brush to a maximum pore dimension and a minimum pore dimension, wherein the maximum pore dimension is 1000 nanometers (nm) and wherein the minimum pore dimension is 50 nanometers (nm).

2. The method of claim 1, wherein the brush is formed from a material, and wherein controlling formation of pores within the brush to the maximum pore dimension comprises limiting a degree of polymerization within the material to from 500 to 20,000 degrees of polymerization.

3. The method of claim 1, wherein the brush is formed from a material, and wherein controlling formation of pores within the brush to the maximum pore dimension comprises generating nanobubbles having a maximum diameter of 1000 nanometers (nm) in the material.

4. The method of claim 1, wherein the brush is formed from a material, and wherein controlling formation of pores within the brush to the maximum pore dimension comprises adding a pore-forming chemical as filler to the material.

5. The method of claim 1, wherein forming the brush comprises synthesizing a polyvinyl (PVA)-copolymer material.

6. The method of claim 1, wherein forming the brush comprises synthesizing a polyvinyl (PVA)-copolymer material with a polymer backbone selected from cellulose, lignin, nylon, and polytetrafluoroethylene (PTFE).

7. The method of claim 1, wherein forming the brush comprises synthesizing a functionalized polyvinyl (PVA) polymer.

8. The method of claim 1, wherein forming the brush comprises synthesizing a functionalized PVA polymer with a polymer backbone selected from cellulose, lignin, nylon, and polytetrafluoroethylene (PTFE).

9. A method for fabricating a brush for cleaning wafers after a Chemical Mechanical Polishing (CMP) process, the method comprising:

forming the brush with an outer surface configured for contacting the wafers, wherein the outer surface is formed from a material selected from a PVA-copolymer material with a polymer backbone selected from cellulose, lignin, nylon, and polytetrafluoroethylene (PTFE) and a functionalized PVA polymer material with a polymer backbone selected from cellulose, lignin, nylon, and polytetrafluoroethylene (PTFE).

10. The method of claim 9, wherein forming the brush comprises synthesizing the PVA-copolymer material with a polymer backbone selected from cellulose, lignin, nylon, and polytetrafluoroethylene (PTFE).

11. The method of claim 9, wherein forming the brush comprises synthesizing the functionalized PVA polymer with a polymer backbone selected from cellulose, lignin, nylon, and polytetrafluoroethylene (PTFE).

12. The method of claim 9, further comprising, while forming the brush, controlling formation of pores within the brush to a maximum pore dimension.

13. The method of claim 12, wherein controlling formation of pores within the brush to a maximum pore dimension comprises maintaining a degree of polymerization (DP) of from 500 to 20000.

14. A method for fabricating a brush, the method comprising:

forming the brush from a material; and while forming the brush, generating nanobubbles having a maximum diameter of 1000 nanometers (nm) in the material.

15. The method of claim 14, wherein the nanobubbles have a minimum nanobubble dimension of 50 nm.

16. The method of claim 14, wherein the material is a polyvinyl (PVA)-copolymer selected from PVA-b-PS, PVA-b-PMMA, PVA-b-PEG, and PVA-b-PMA.

17. The method of claim 14, wherein the material is a functionalized polyvinyl (PVA) polymer selected from PVA-COOH, PVA-SO$_3$H, and PVA-NH$_2$.

18. The method of claim 14, wherein the material has a polymer backbone selected from cellulose, lignin, nylon, and polytetrafluoroethylene (PTFE).

19. The method of claim 14, wherein generating nanobubbles having a maximum diameter of 1000 nanometers (nm) in the material comprises maintaining a degree of polymerization (DP) of from 500 to 20000.

20. The method of claim 14, wherein the material is selected from a polyvinyl (PVA)-copolymer and a functionalized polyvinyl (PVA) polymer.

* * * * *